(12) United States Patent
Punzalan et al.

(10) Patent No.: US 7,936,053 B2
(45) Date of Patent: May 3, 2011

(54) INTEGRATED CIRCUIT PACKAGE SYSTEM WITH LEAD STRUCTURES INCLUDING A DUMMY TIE BAR

(75) Inventors: Jeffrey D. Punzalan, Singapore (SG); Henry D. Bathan, Singapore (SG); Il Kwon Shim, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 522 days.

(21) Appl. No.: 11/558,387

(22) Filed: Nov. 9, 2006

(65) Prior Publication Data

US 2007/0114645 A1    May 24, 2007

Related U.S. Application Data

(60) Provisional application No. 60/597,243, filed on Nov. 17, 2005.

(51) Int. Cl.
    *H01L 23/495* (2006.01)
(52) U.S. Cl. ................... 257/670; 257/E23.012

(58) Field of Classification Search .......... 257/666–677, 257/66, E23.001, E23.012; 438/106–127
See application file for complete search history.

(56) References Cited

U.S. PATENT DOCUMENTS

| 5,442,233 | A  | * | 8/1995 | Anjoh et al. ............... 257/675 |
| 5,939,776 | A  |   | 8/1999 | Kim et al. |
| 6,031,281 | A  | * | 2/2000 | Kang et al. ................ 257/692 |
| 6,348,726 | B1 |   | 2/2002 | Bayan et al. |
| 6,400,004 | B1 |   | 6/2002 | Fan et al. |
| 6,525,406 | B1 | * | 2/2003 | Chung et al. .............. 257/666 |
| 6,617,197 | B1 |   | 9/2003 | Bayan et al. |

FOREIGN PATENT DOCUMENTS

| EP | 0455245 A2 | * | 2/1991 |
| JP | 357192058  | * | 11/1982 |

* cited by examiner

*Primary Examiner* — Brook Kebede
(74) *Attorney, Agent, or Firm* — Mikio Ishimaru

(57) ABSTRACT

An integrated circuit package system includes forming lead structures including a dummy tie bar having an intersection with an outer edge of the integrated circuit package system, and connecting an integrated circuit die to the lead structures.

20 Claims, 4 Drawing Sheets

INTEGRATED CIRCUIT PACKAGE SYSTEM WITH LEAD STRUCTURES INCLUDING A DUMMY TIE BAR

CROSS-REFERENCE TO RELATED APPLICATION(S)

This application claims the benefit of U.S. Provisional Patent Application Ser. No. 60/597,243 filed Nov. 17, 2005.

TECHNICAL FIELD

The present invention relates generally to integrated circuits, and more particularly to integrated circuit package systems.

BACKGROUND ART

An integrated circuit ("IC") chip or die is a small electronic device limited by the "real estate" available for mounting the packaged chip. Even larger form factor systems, such as PC's, compute servers, and storage servers, need more integrated circuits in the same or smaller "real estate". Particularly acute are the needs for portable personal electronics, such as cell phones, digital cameras, music players, PDA's, and location-based devices, further driving the need for integrated circuit packaging density.

It is conventional in the electronics industry to encapsulate one or more semiconductor devices, such as IC dies, into semiconductor packages. These semiconductor packages protect the IC dies from environmental hazards and assist in electrically and mechanically attaching the IC dies to other electronic devices. Commonly, such semiconductor packages include metal leadframes for supporting IC dies. A leadframe is a metal frame that usually includes a paddle that supports an IC die after it has been cut from the wafer. The leadframe has lead fingers that provide external electrical connections for the IC die.

An IC die is bonded to the die paddle region, formed centrally on the leadframe. Conductors such as bond wires electrically connect pads on the IC die to individual leads or lead fingers of the leadframe. That is, the IC die is attached to the die paddle, and then bonding pads of the IC die are connected to the lead fingers via wire bonding or flip die bumping to provide the external electrical connections. A hard plastic or epoxy encapsulating material ("encapsulant") is then applied to form the exterior of the semiconductor package, covering the bond wires, the IC die, and (when present) other associated components.

Although the leadframe is the central supporting structure of the semiconductor package, only a portion of the leadframe is surrounded by the plastic encapsulant. Some portions of the leadframe provide external structure by being exposed or extending beyond the semiconductor package to electrically connect and physically support the semiconductor package.

Once the IC dies have been produced and encapsulated in semiconductor packages, as described above, they may be used in a wide variety of electronic devices. The number and variety of electronic devices utilizing semiconductor packages has grown dramatically in recent years. These electronic devices include personal computers, workstations, compute servers, storage servers, and even more increasingly portable personal electronics.

One example of a semiconductor package is the dual row QFN package, which was designed and developed to increase the number of terminal pads/leads for connection to the other components in these electronic devices. However, as the market demand increased for more applications of the same package, the package required terminal pads/leads in different configurations and this resulted in manufacturing problems.

The semiconductor packages are manufactured in long, wide strips that are singulated, or separated, into individual semiconductor packages. When using mechanical sawing or scribing techniques for singulation, cracks or chipouts are caused by cracks that radiate away from the scribe between the semiconductor packages. In chipouts, a portion of the encapsulant actually breaks out. With cracking, cracks may propagate through the encapsulant and destroy the environmental protection provided by the encapsulant.

These types of defects result in lost revenue when the cracked die is discovered before sale, as well as product failures and dissatisfied customers if the defect in the die is not discovered until after the purchase.

Thus, a need still remains for an integrated circuit package system to provide improved configurability and manufacturing yield. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides forming lead structures including a dummy tie bar having an intersection with an outer edge of the integrated circuit package system, and connecting an integrated circuit die to the lead structures.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
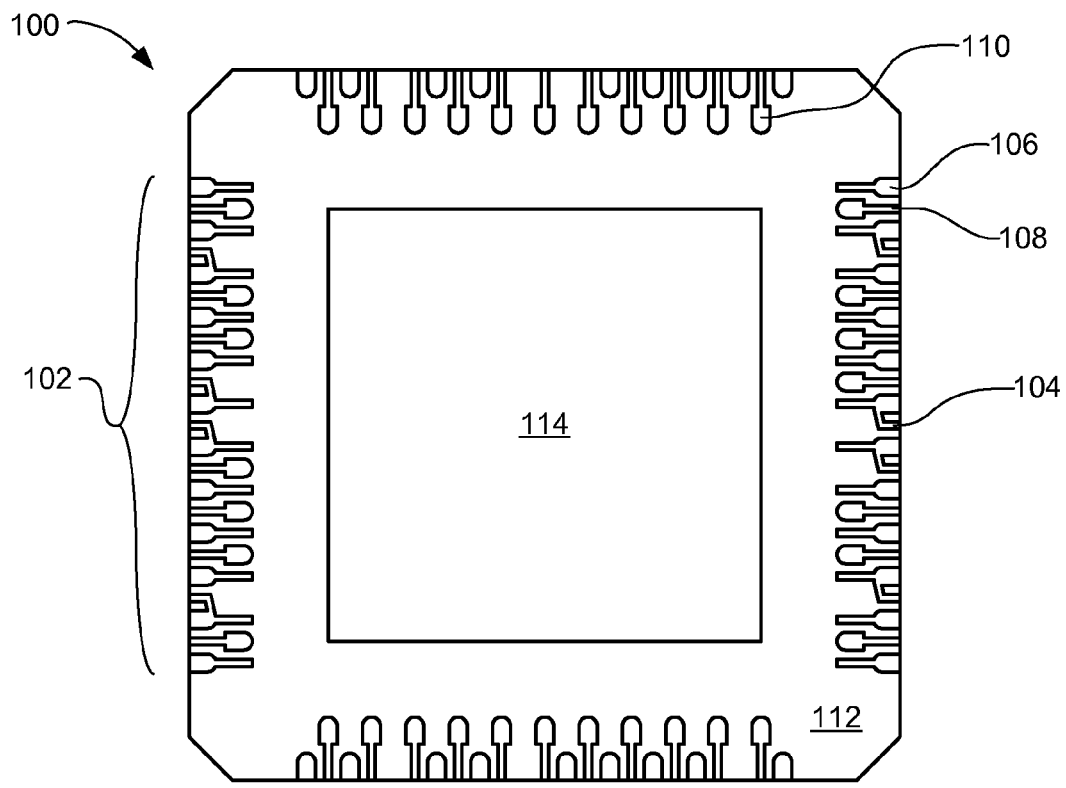
FIG. 1 is a top plan view of an integrated circuit package system in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes stamping, forging, patterning, exposure, development, etching, cleaning, and/or removal of the material or laser trimming as required in forming a described structure. The term "system" as used herein means and refers to the method and to the apparatus of the present invention in accordance with the context in which the term is used.

Referring now to FIG. 1, therein is shown a top plan view of an integrated circuit package system 100 in an embodiment of the present invention. The integrated circuit package system 100 includes lead structures 102. The lead structures 102 include dummy tie bars 104 that can be attached to outer terminal pads 106. The lead structures 102 also include inner terminal tie bars 108 that can be attached to inner terminal pads 110 to provide a substantially fixed position for the inner terminal pads 110 during processing. Processing can include formation of an encapsulant 112 around the lead structures 102 and a pad 114, such as a die pad.

The dummy tie bars 104 can be formed between two or more of the lead structures 102 in the same row and having a spacing greater than or equal to a minimum dimension of one of the lead structures 102 and two of a minimum spacing of the lead structures 102. The dummy tie bars 104 can also be attached to the outer terminal pads 106. For illustrative purposes, the dummy tie bars 104 and the inner terminal tie bars 108 are shown having approximately the same cross-sectional dimensions, although it is understood that the dummy tie bars 104 may be formed having any cross-sectional dimension.

The lead structures 102 can be formed such that a singulation process intersects the dummy tie bars 104, the outer terminal pads 106, and the inner terminal tie bars 108 at an extent of the integrated circuit package system 100. The dummy tie bars 104, the outer terminal pads 106, and the inner terminal tie bars 108 can form a portion of an outer edge of the integrated circuit package system 100.

It has been unexpectedly discovered that the dummy tie bars 104 of the integrated circuit package system 100 provide structural integrity to an extent of the integrated circuit package system 100.

Figure 2:
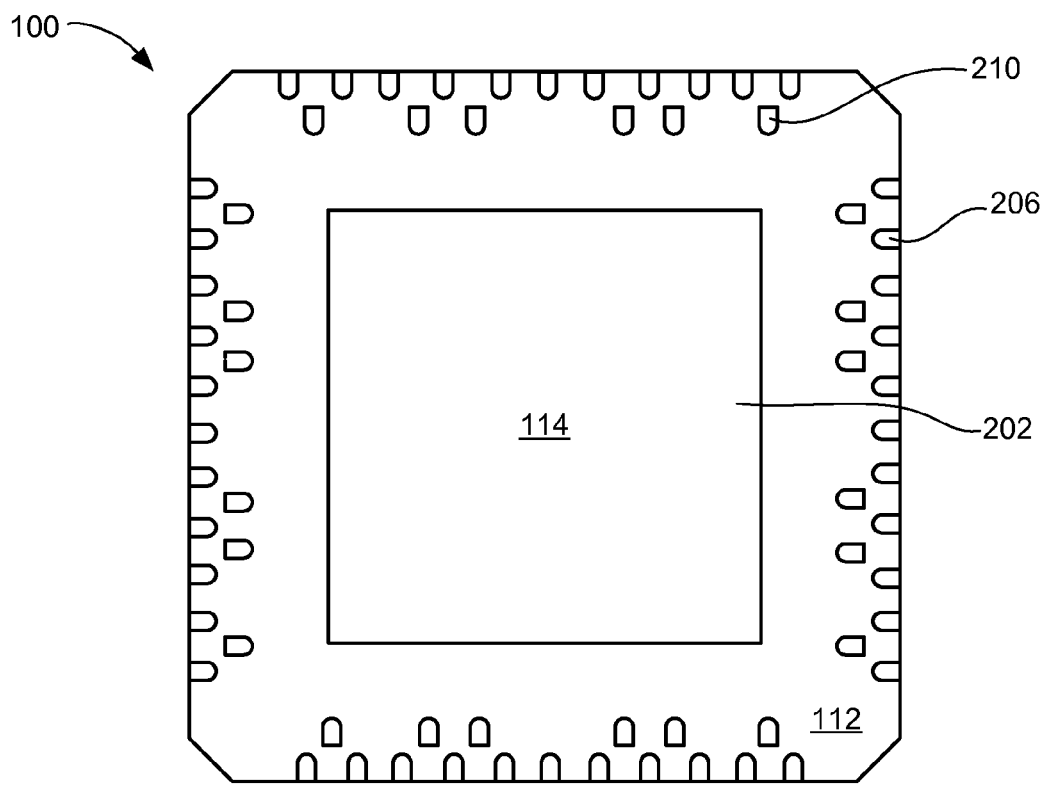
FIG. 2 is a bottom plan view of the integrated circuit package system.

Referring now to FIG. 2, therein is shown a bottom plan view of the integrated circuit package system 100. The integrated circuit package system 100 includes the pad 114 optionally having a pad exposed surface 202 without the encapsulant 112. The pad 114 can provide any or all of thermal conductivity or electrical connectivity for a next level system, such as a printed circuit board. The integrated circuit package system 100 also includes an outer terminal pad exposed surface 206 of the outer terminal pads 106 of FIG. 1 and an inner terminal pad exposed surface 210 of the inner terminal pads 110 of FIG. 1. The outer terminal pad exposed surface 206 and the inner terminal pad exposed surface 210 can provide electrical connectivity between the integrated circuit package system 100 and the next level system.

It has been unexpectedly discovered that the integrated circuit package system 100 having the dummy tie bars 104 substantially eliminates chip-out, such as chipping near an edge of the integrated circuit package system 100 resulting in cavities. Further, it has been unexpectedly discovered that the integrated circuit package system 100 having the dummy tie bars 104 substantially eliminates cracks near the edge of the integrated circuit package system 100.

Figure 3:
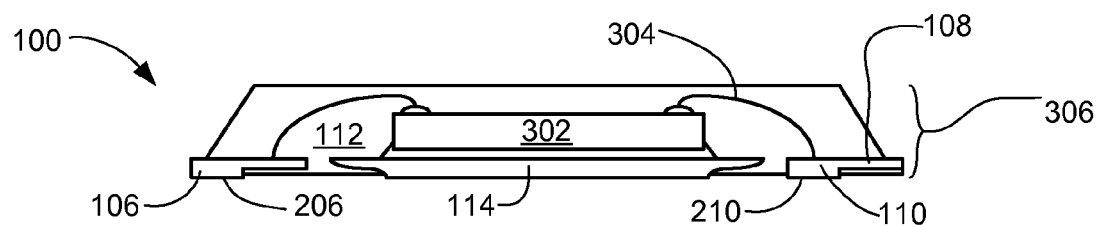
FIG. 3 is a cross-sectional view of the integrated circuit package system.

Referring now to FIG. 3, therein is shown a cross-sectional view of the integrated circuit package system 100. The integrated circuit package system 100 includes the outer terminal pads 106 having the outer terminal pad exposed surface 206 and the inner terminal pads 110 having the inner terminal pad exposed surface 210. An integrated circuit die 302 is attached over the pad 114. The integrated circuit die 302 can be electrically connected to the outer terminal pads 106 and the inner terminal pads 110 by electrical connectors 304, such as bond wires. The encapsulant 112 covers and protects the integrated circuit die 302, the electrical connectors 304, a portion of the outer terminal pads 106, and a portion of the inner terminal pads 110 to form an integrated circuit package 306, such as a fine pitch dual row quad flat no-lead package.

The dummy tie bars 104 of FIG. 1, the outer terminal pads 106 and the inner terminal tie bars 108 can be formed such that a singulation process intersects the dummy tie bars 104, the outer terminal pads 106, and the inner terminal tie bars 108 at an extent of the integrated circuit package 306. The dummy tie bars 104, the outer terminal pads 106, and the inner terminal tie bars 108 can be exposed at an extent of the integrated circuit package 306.

Figure 4:
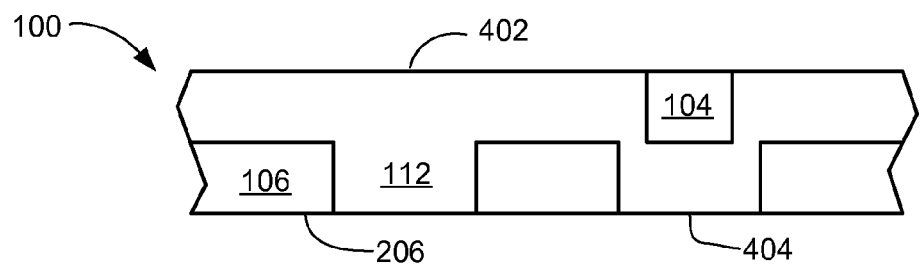
FIG. 4 is a cross-sectional view near an outer extent of the integrated circuit package system.

Referring now to FIG. 4, therein is shown a cross-sectional view near an outer extent of the integrated circuit package system 100. The integrated circuit package system 100 includes the dummy tie bars 104, and the outer terminal pads 106. The encapsulant 112 covers and protects a portion of the dummy tie bars 104, and the outer terminal pads 106 forming an upper encapsulant surface 402. The outer terminal pad exposed surface 206 can be substantially coplanar to a lower encapsulant surface 404 of the encapsulant 112 without the need to be covered by the encapsulant 112.

Figure 5:
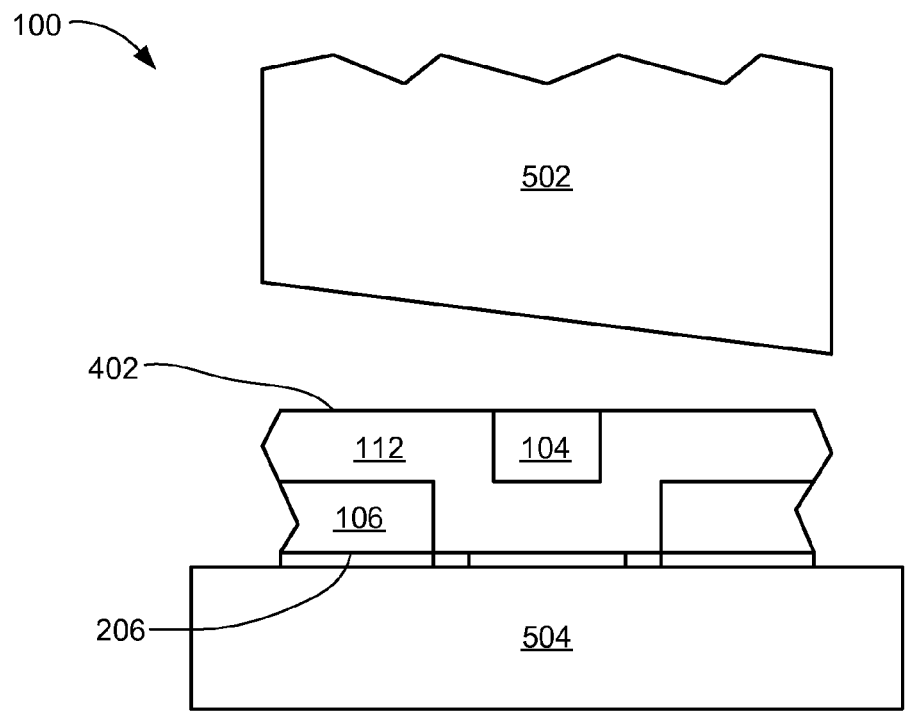
FIG. 5 is a cross-sectional view of the integrated circuit package system in a singulation phase.

Referring now to FIG. 5, therein is shown a cross-sectional view of the integrated circuit package system 100 in a singulation phase. The integrated circuit package system 100 can be formed by a singulation process, such as cutting. A singulation tool 502 can be applied to the upper encapsulant surface 402. The integrated circuit package system 100 can be mounted over a singulation surface 504, such as a die insert.

The dummy tie bars 104, the outer terminal pads 106 and the inner terminal tie bars 108 can be formed such that the singulation tool intersects the dummy tie bars 104, the outer terminal pads 106, and the inner terminal tie bars 108 at an extent of the integrated circuit package system 100.

Figure 6:
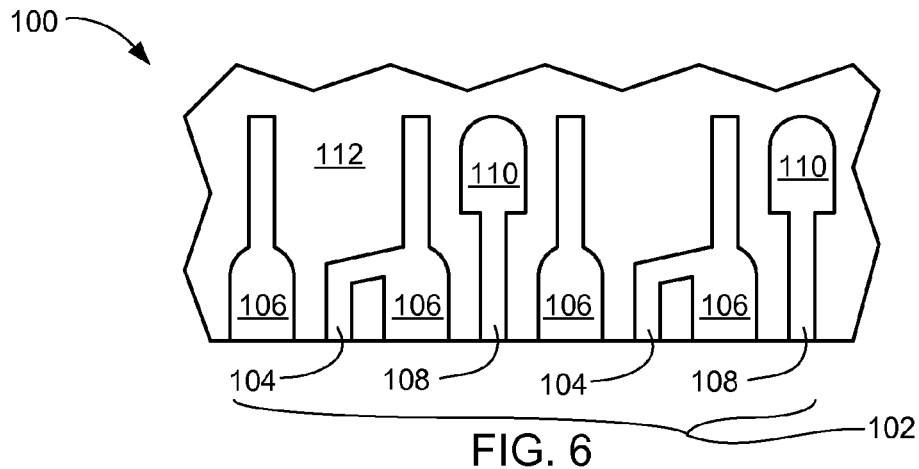
FIG. 6 is a plan view of the lead structures of the integrated circuit package system.

Referring now to FIG. 6, therein is shown a plan view of the lead structures 102 of the integrated circuit package system 100. The lead structures 102 include the dummy tie bars 104 that can be attached to the outer terminal pads 106 in a region without the need for the inner terminal pads 110 and thereby without the inner terminal tie bars 108. The dummy tie bars 104 provide structural integrity to an edge of the integrated circuit package system 100 during processing. Processing can include singulation near an extent of the integrated circuit package system 100. The lead structures 102 also include the inner terminal tie bars 108 that can be attached to the inner terminal pads 110. The inner terminal tie bars 108 provide a substantially fixed position for the inner terminal pads 110 during processing. Processing can include formation of the encapsulant 112 around the lead structures 102.

Figure 7:
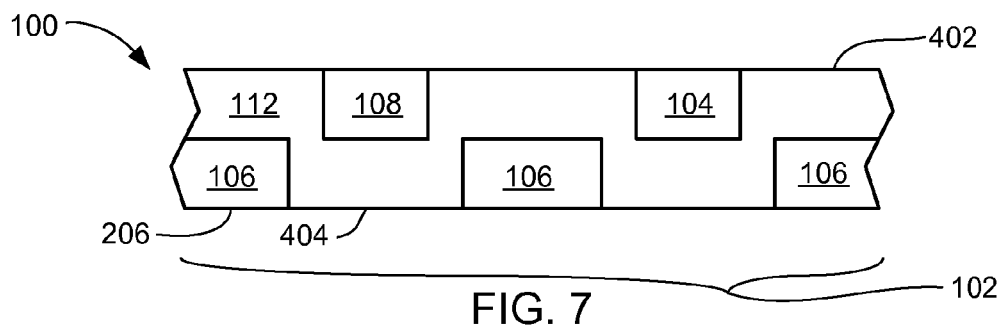
FIG. 7 is a cross-sectional view of the lead structures of the integrated circuit package system.

Referring now to FIG. 7, therein is shown a cross-sectional view of the lead structures 102 of the integrated circuit package system 100. The integrated circuit package system 100 includes the dummy tie bars 104, the outer terminal pads 106, and the inner terminal tie bars 108. The dummy tie bars 104 can be formed in a region without the need for the inner terminal pads 110 and thereby without the inner terminal tie bars 108. The dummy tie bars 104 provide structural integrity to the edge of the integrated circuit package system 100 during processing. The encapsulant 112 covers and protects a portion of the dummy tie bars 104, the outer terminal pads 106, and the inner terminal tie bars 108, forming the upper encapsulant surface 402. The outer terminal pad exposed surface 206 can be substantially coplanar to the lower encapsulant surface 404 of the encapsulant 112 without the need to be covered by the encapsulant 112.

Figure 8:
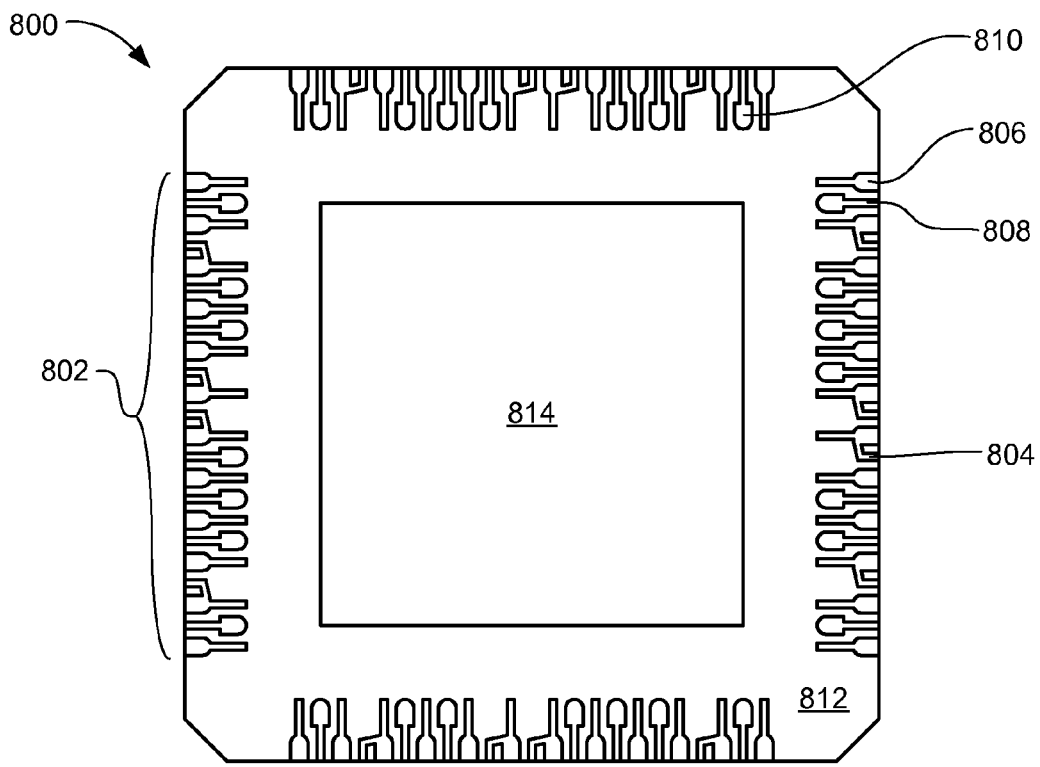
FIG. 8 is a top plan view of an integrated circuit package system in another embodiment of the present invention.

Referring now to FIG. 8, therein is shown a top plan view of an integrated circuit package system 800 in another embodiment of the present invention. The integrated circuit package system 800 includes lead structures 802. The lead structures 802 include dummy tie bars 804 that can be attached to outer terminal pads 806. The lead structures 802 also include inner terminal tie bars 808 that can be attached to inner terminal pads 810 to provide a substantially fixed position for the inner terminal pads 810 during processing. Processing can include formation of an encapsulant 812 around the lead structures 802 and a pad 814, such as a die pad.

The dummy tie bars 804 can be formed between two or more of the lead structures 802 having a spacing greater than or equal to a minimum dimension of one of the lead structures 802 and two of a minimum spacing of the lead structures 802. The dummy tie bars 804 can be attached to the outer terminal pads 806. For illustrative purposes, the dummy tie bars 804 are shown as formed on all four sides of the integrated circuit package system 800, although it is understood that the dummy tie bars 804 may be formed on any number of sides of the integrated circuit package system 800.

The lead structures 802 can be formed such that a singulation process intersects the dummy tie bars 804, the outer terminal pads 806, and the inner terminal tie bars 808 at an extent of the integrated circuit package system 800. The dummy tie bars 804, the outer terminal pads 806, and the inner terminal tie bars 808 can form a portion of an outer edge of the integrated circuit package system 800.

It has been unexpectedly discovered that the dummy tie bars 804 of the integrated circuit package system 800 provide structural integrity to an extent of the integrated circuit package system 800.

Figure 9:
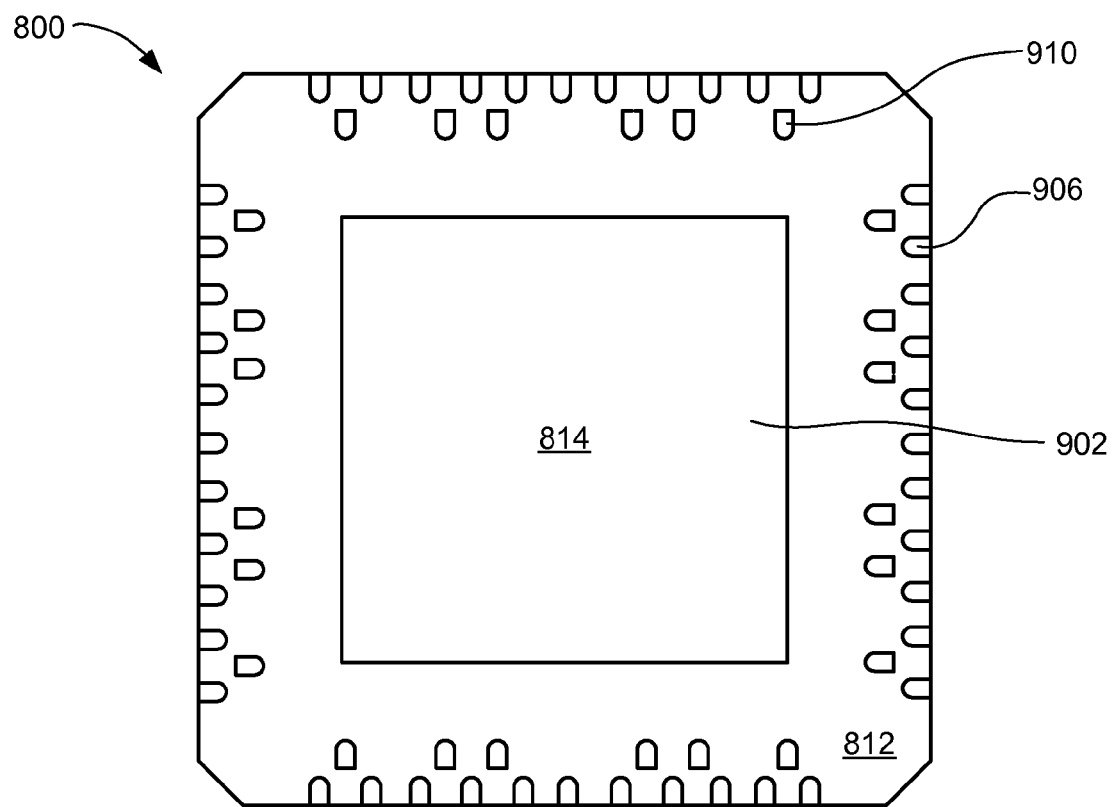
FIG. 9 is a bottom plan view of the integrated circuit package system.

Referring now to FIG. 9, therein is shown a bottom plan view of the integrated circuit package system 800. The integrated circuit package system 800 includes the pad 814 optionally having a pad exposed surface 902 without the encapsulant 812. The pad 814 can provide any or all of thermal conductivity or electrical connectivity for a next level system, such as a printed circuit board. The integrated circuit package system 800 also includes an outer terminal pad exposed surface 906 of the outer terminal pads 806 of FIG. 1 and an inner terminal pad exposed surface 910 of the inner terminal pads 810 of FIG. 1. The outer terminal pad exposed surface 906 and the inner terminal pad exposed surface 910 can provide electrical connectivity between the integrated circuit package system 800 and the next level system.

It has been unexpectedly discovered that the integrated circuit package system 800 having the dummy tie bars 804 substantially eliminates chip-out, such as chipping near an edge of the integrated circuit package system 800 resulting in cavities. Further, it has been unexpectedly discovered that the integrated circuit package system 800 having the dummy tie bars 804 substantially eliminates cracks near the edge of the integrated circuit package system 800.

Figure 10:
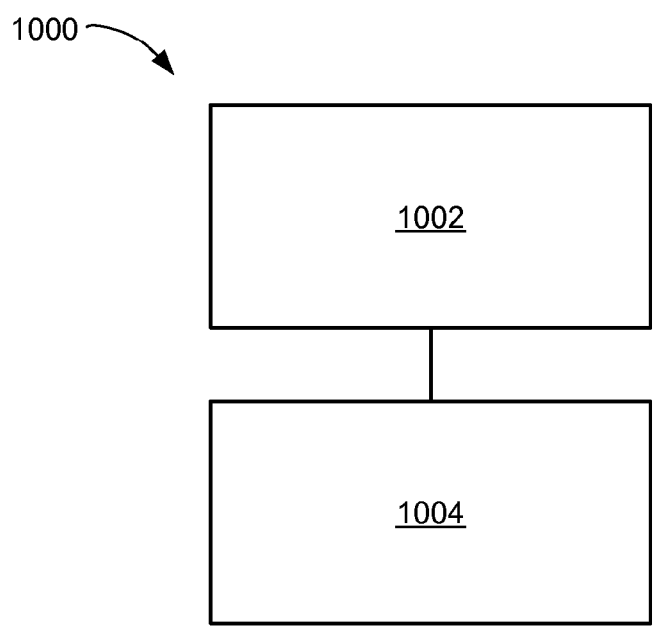
FIG. 10 is a flow chart of an integrated circuit package system for manufacturing the integrated circuit package system in an embodiment of the present invention.

Referring now to FIG. 10, therein is shown a flow chart of an integrated circuit package system 1000 for manufacturing the integrated circuit package system 100 in an embodiment of the present invention. The system 1000 includes forming lead structures including a dummy tie bar having an intersection with an outer edge of the integrated circuit package system in a block 1002; and connecting an integrated circuit die to the lead structures in a block 1004.

In greater detail, a system to provide the method and apparatus of the integrated circuit package system 100, in an embodiment of the present invention, is performed as follows:
1. Forming lead structures including a dummy tie bar having an intersection with an outer edge of the integrated circuit package system and an outer terminal pad.
2. Connecting an integrated circuit die to the outer terminal pad.
3. Singulating an integrated circuit package including the integrated circuit die.

It has been discovered that the present invention thus has numerous aspects.

An aspect is that the present invention provides different layouts of the outer terminal pads and the inner terminal pads. The different layouts can include any configuration of the outer terminal pads or the inner terminal pads.

Another aspect is that the present invention provides depopulation of outer terminal pads and inner terminal pads. The different layouts can also include depopulation of one or more of the outer terminal pads or the inner terminal pads.

Yet another important aspect is that the present invention provides the dummy tie bars. The depopulation of outer terminal pads or inner terminal pads can be replaced with the dummy tie bars.

Yet another important aspect is that the present invention provides the pad exposed. The pad, such as a die pad, can include the pad exposed surface without the need to be covered by the encapsulant.

It has been discovered that the disclosed structure substantially eliminates chip-out such as chipping near an edge of the integrated circuit package. The chip-out can result in cavities, recessed regions, and irregularities.

It has also been discovered that the disclosed structure substantially eliminates cracks near the edge of the integrated circuit package. Cracking can allow contaminants into the integrated circuit package affecting performance or function.

Another discovery is that the disclosed structure meets market demands with different layouts of the outer terminal pads and the inner terminal pads. Product application and functions can demand specific configurations for connectivity.

Yet another discovery is that the disclosed structure provides compatibility with the fine pitch dual row quad flat no lead packages. The dummy tie bars are compatible with fine pitch dual row quad flat no lead packaging.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system, method, and apparatus, of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hitherto fore set forth herein or shown in the accompanying drawings are to be interpreted in an illustrative and non-limiting sense.

What is claimed is:

1. A method for manufacturing an integrated circuit package system comprising:
   providing lead structures in a row;
   forming a dummy tie bar between the lead structures in the row and directly attached to an outer lead, the dummy tie bar having an intersection with an outer edge of the integrated circuit package system; and
   connecting an integrated circuit die to the lead structures.

2. The method as claimed in claim 1 wherein forming the lead structures includes forming the dummy tie bar near an outer terminal pad.

3. The method as claimed in claim 1 wherein forming the lead structures includes forming an inner terminal pad.

4. The method as claimed in claim 1 wherein forming the lead structures includes forming an inner terminal tie bar.

5. The method as claimed in claim 1 further comprising singulating the integrated circuit die.

6. A method for manufacturing an integrated circuit package system comprising:
   providing lead structures;
   forming a dummy tie bar between the lead structures and directly attached to an outer lead, the dummy tie bar having an intersection with an outer edge of the integrated circuit package system and an outer terminal pad;
   connecting an integrated circuit die to the outer terminal pad; and
   singulating an integrated circuit package including the integrated circuit die, the dummy tie bar attached to an outer lead.

7. The method as claimed in claim 6 wherein forming the lead structures includes forming the dummy tie bar attached to the outer terminal pad.

8. The method as claimed in claim 6 wherein forming the lead structures includes forming an inner terminal pad adjacent to the outer terminal pad.

9. The method as claimed in claim 6 wherein forming the lead structures includes forming an inner terminal tie bar adjacent to the outer terminal pad.

10. The method as claimed in claim 6 wherein singulating the integrated circuit package includes forming the dummy tie bar near an edge of the integrated circuit package.

11. An integrated circuit package system comprising:
    lead structures:
    a dummy tie bar between the lead structures directly attached to an outer lead, the dummy tie bar having an intersection with an outer edge of the integrated circuit package system; and
    an integrated circuit die connected to the lead structures.

12. The system as claimed in claim 11 wherein the lead structures includes the dummy tie bar near an outer terminal pad.

13. The system as claimed in claim 11 wherein the lead structures includes an inner terminal pad.

14. The system as claimed in claim 11 wherein the lead structures includes an inner terminal tie bar.

15. The system as claimed in claim 11 further comprising the integrated circuit die singulated.

16. The system as claimed in claim 11 wherein:
    the lead structures are the lead structures including the dummy tie bar having an intersection with an outer edge of the integrated circuit package system and an outer terminal pad;
    the integrated circuit is the integrated circuit connected to the outer terminal pad; and further comprising:
    an integrated circuit package including the integrated circuit die.

17. The system as claimed in claim 16 wherein the lead structures includes the dummy tie bar attached to the outer terminal pad.

18. The system as claimed in claim 16 wherein the lead structures includes an inner terminal pad adjacent to the outer terminal pad.

19. The system as claimed in claim 16 wherein the lead structures includes an inner terminal tie bar adjacent to the outer terminal pad.

20. The system as claimed in claim 16 wherein the integrated circuit package includes the dummy tie bar near an edge of the integrated circuit package.

* * * * *